(12) United States Patent
Nariman et al.

(10) Patent No.: US 6,822,260 B1
(45) Date of Patent: Nov. 23, 2004

(54) LINEWIDTH MEASUREMENT STRUCTURE WITH EMBEDDED SCATTEROMETRY STRUCTURE

(75) Inventors: Hormuzdiar E. Nariman, Austin, TX (US); Derick J. Wristers, Bee Caves, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/298,664

(22) Filed: Nov. 19, 2002

(51) Int. Cl.[7] .............................................. H01L 23/58
(52) U.S. Cl. ...................... 257/48; 250/306; 250/491.1; 324/158.1; 438/15; 364/490
(58) Field of Search .................. 257/48, 632; 250/306, 250/491.1; 324/158.1; 438/15; 364/490

(56) References Cited

U.S. PATENT DOCUMENTS 4,516,071 A * 5/1985 Buehler ...................... 324/765
5,920,067 A * 7/1999 Cresswell et al. ........... 250/306
6,057,171 A * 5/2000 Chou et al. ................... 438/15

* cited by examiner

*Primary Examiner*—Nathan J. Flynn
*Assistant Examiner*—Scott R Wilson

(57) ABSTRACT

A method of manufacturing a semiconductor device includes depositing a layer over a substrate and etching the layer to form a grating structure, a cross bridge test structure and a line width measurement structure. The grating structure includes a plurality of parallel lines and one of the multiple parallel lines is connected to the line width measurement structure and the cross bridge test structure. A scatterometry test is performed on the grating structure to obtain a line width and this width is compared to a line width calculated using the line width measurement structure. A semiconductor device is also disclosed.

19 Claims, 3 Drawing Sheets

LINEWIDTH MEASUREMENT STRUCTURE WITH EMBEDDED SCATTEROMETRY STRUCTURE

FIELD OF THE INVENTION

The present invention relates to the manufacturing of semiconductor devices, and more particularly, to forming strained-silicon devices having improved characteristics.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS device includes a bulk semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS device is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

During the manufacturing process, a semiconductor device undergoes many types of metrology tests to ensure the quality of the semiconductor device. For example, processes, such as lithography, are controlled, in part, by taking dimensional measurements of certain features of the semiconductor device formed by the lithography process. One type of measurement technique used to measure the dimensions of a structure in a semiconductor device is scatterometry. Scatterometry is a non-destructive optical technique that records and analyzes changes in the intensity of light reflected from a periodic scattering surface. By measuring and analyzing the light diffracted from a patterned periodic sample, the dimensions of the sample structure can be measured. Other types of measurement techniques used to measure the dimension of a structure are electrical tests, known as I-force and V-measure. These tests use known parameters, such as length of a line, and calculated parameters, such as sheet resistance, to calculate line width based on voltage drop across electrodes connected to the line. These different types of metrology tests, however, use different structures on the semiconductor device. As such, cross-correlating the results of these metrology tests has not been possible. Furthermore, the width of the lines in two different test structures can vary as a result of process used to form the lines. As the size of structures are becoming increasingly smaller, the variation in line width introduced by the manufacturing process becomes increasingly significant to the accuracy of the testing. Accordingly, a need exists for an improved semiconductor device and method of forming the same that allows for cross-correlation of results from different types of metrology tests and eliminates line width disparity between two different test structures.

SUMMARY OF THE INVENTION

This and other needs are met by embodiments of the present invention which provide a method of manufacturing a semiconductor device that allows for a direct comparison of a line width calculated by optical scatterometry metrology and a line width calculated by an electrical line width measurement test. The method includes depositing a layer over a substrate and etching the layer to form a grating structure, a cross bridge test structure and a line width measurement structure. The grating structure includes a plurality of parallel lines and one of the multiple parallel lines is connected to the line width measurement structure and the cross bridge test structure. A scatterometry test is performed on the grating structure to obtain a line width and this width is compared to a line width calculated using the line width measurement structure.

In another embodiment of the present invention, a semiconductor device is provided. The semiconductor device includes a grating structure with a plurality of parallel lines. One of the parallel lines is connected to a line width measurement structure. The line is also connected to a sheet resistance test structure. The line width measurement structure is formed from first and second pairs of electrodes, and the sheet resistance test structure is a cross bridge test structure formed from the second pair of electrodes and a third pair of electrodes.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention allows for cross-correlation of the same measured dimension using two different types of metrology testing techniques. This is achieved, in part, by providing a semiconductor device having a grating structure connected to a line width test structure. A line width can then be measured both optically, using a technique such as scatterometry with the grating structure, and electrically, using a technique with the line width test structure.

An exemplary method of manufacturing a semiconductor device having two combined test structures is illustrated in FIGS. 1–4. Although FIGS. 1–4 describe that the combined test structures are formed using the same layers as a gate electrode of a transistor, the invention is not limited in this manner, as the combined test structures can be formed separately or formed from the layer(s) used to form other structures in the semiconductor device, such as metal lines in inter-level dielectrics.

Figure 1:
FIGS. 1–4 schematically illustrate sequential phases of a method of forming a semiconductor device with embedded test structures according to one embodiment of the present invention.

In FIG. 1, a layer, such as a gate dielectric 16, is formed on a top surface of the substrate 10, and the gate dielectric 16 is not limited as to a particular material. For example, the gate dielectric 16 can be formed from a high-K material or from a material such as silicon dioxide. The formation of a silicon dioxide gate dielectric 16, for example, can be accomplished using thermal oxidation at temperatures between about 700 and about 1000° C. in an oxygen-steam ambient. Although not limited in this manner, the gate dielectric 16 can have a thickness between about 3 and about 20 nanometers. The substrate 10 can be formed from such materials as silicon, strained silicon, and silicon-on-insulator (SOI).

Figure 2:
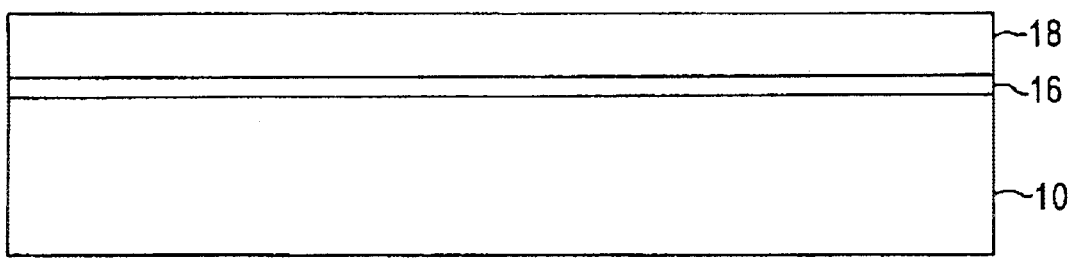
Figure 3:
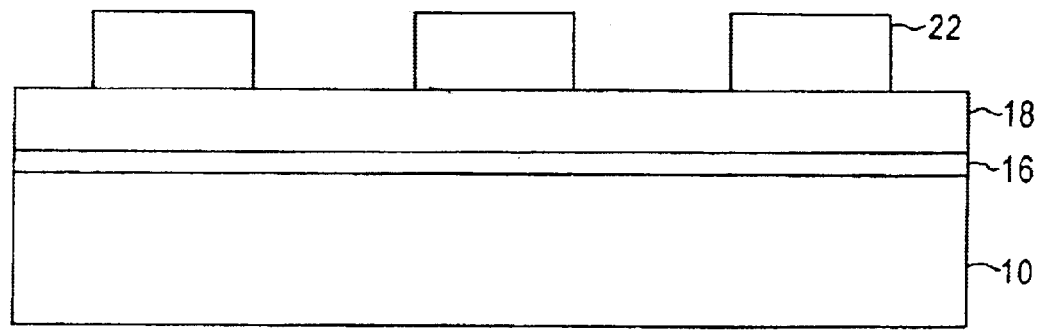
Figure 4:
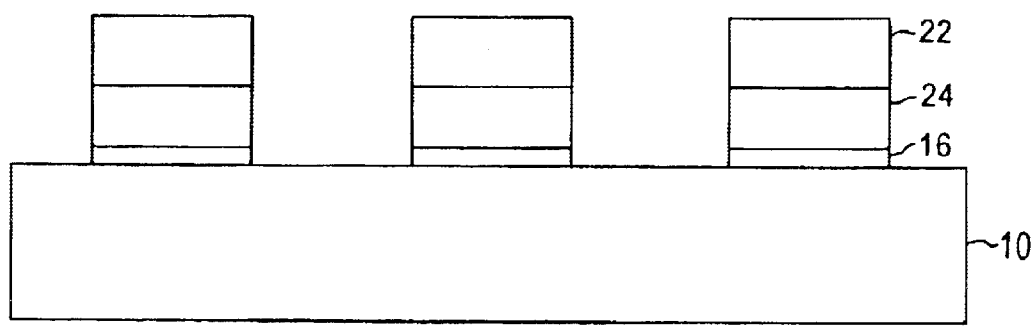

After formation of the gate dielectric 16, a gate electrode is formed over the gate dielectric 16. Although not limited in this manner, an exemplary method of forming a gate electrode is illustrated in FIGS. 2–4. In FIG. 2, a layer of undoped polysilicon 18 is blanket deposited, for example by low pressure chemical vapor deposition (LPCVD) at temperatures between about 600 and about 800° C., on the top surface of gate dielectric 16. Although not limited in this manner, the polysilicon layer 18 can have a thickness between about 50 and about 500 nanometers. The polysilicon layer 18 can then he implanted with nitrogen ions. The implanted nitrogen ions, for example, can be used to retard the diffusion of boron atoms. The implantation of the nitrogen ions can be at a dosage between about $5 \times 10^{14}$ and about $5 \times 10^{15}$ dopants/cm$^2$ and at an energy level between about 20 and about 200 keV.

The polysilicon layer 18 is then etched to form the gate electrode. As illustrated in FIG. 3, the etching involves forming a photoresist 22 on the polysilicon layer 18, and selectively irradiating the photoresist 22 using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 18, which when removed, will define the gate electrode.

In FIG. 4, an etch, typically anisotropic, is applied to remove the exposed portions of the polysilicon layer 18 and the underlying portions of the gate dielectric 16. After etching, the remaining portion of the polysilicon layer 18 provides a gate electrode 24. Although not limited in this manner, the width of the gate electrode 24 can be from about 20 to 250 nanometers.

Figure 5:
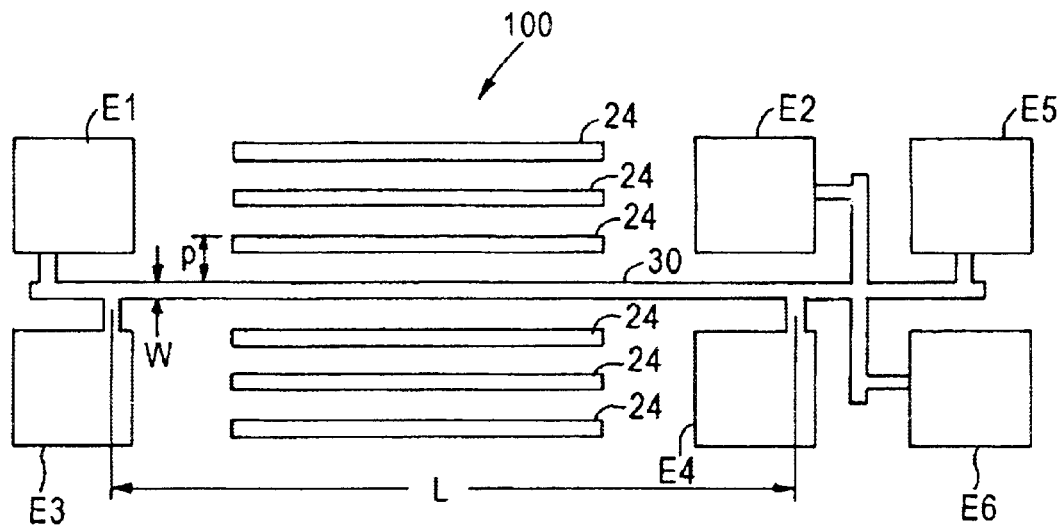
FIG. 5 is a top plan view of a combination test structure according to an embodiment of the present invention.

FIG. 5 illustrates a top view of a grating structure 100 after the photoresist 22 is stripped. The grating structure 100 comprises dummy gate electrodes or dummy lines 24D. The grating structure 100 is not limited as to a particular line width W or pitch P of the lines 24. However, in at least one aspect of the grating structure 100, the line width W is 60 nanometers or less and the pitch P is about three times the line width W. Attached to one of the lines 30 of the grating structure 100 is a line width test structure that can be used to measure the line width W of the line 30. Although not limited in this manner, the line 30 to which the line width test structure is attached can be positioned at the center of the grating structure 100, as viewed from above.

Although any line width test structure capable of measuring line width W is acceptable for use in the semiconductor device, in least one aspect of the invention the line width test structure is a linear bridge formed from a first pair of electrodes E1, E3 and a second pair of electrodes E2, E4 that are interconnected via the line 30. Although not required, the semiconductor device can include a sheet resistance testing structure, and any sheet resistance testing structure capable of measuring sheet resistance is acceptable for use in the semiconductor device. In least one aspect of the invention the sheet resistance testing structure is a cross bridge formed from the second pair of electrodes E2, E4 that are interconnected to a third pair of electrodes E5, E6. Using the structures described above, the line width W of the line 30 is electrically calculated as follows using a probing device commonly known to those skilled in the art:

The resistance $R_L$ of the linear bridge is given by:

$$R_L = \frac{V_{43}}{I_{21}}$$

Where $V_{43} = V_4 - V_3$ (voltage drop measured between electrodes E4 and E3) and $I_{21}$ is a current between electrodes E2 and E1. The sheet resistance $R_S$ of the cross bridge is given by:

$$R_S = \frac{\pi}{LN\ 2}\left(\left(\left(\frac{V_2 - V_4}{I_{56}}\right) + \left(\frac{V_5 - V_2}{I_{64}}\right)\right)/2\right)$$

Resistance $R_L$ of the linear bridge relates to sheet resistance $R_S$ of the cross bridge as follows:

$$R_S = \frac{W}{L} R_L = \frac{W}{L} \frac{V_{43}}{I_{21}}$$

Where L is a length of the line 30 being measured. By rearranging this equation to solve for line width W:

$$W = R_s L \frac{I_{21}}{V_{43}}$$

The line width W of the line 30 can then be calculated using sheet resistance $R_S$, length L of the line 30, drive current $I_{21}$ between electrodes E2 and E1, and voltage drop $V_{43}$ measured between electrodes E4 and E3.

Figure 6:
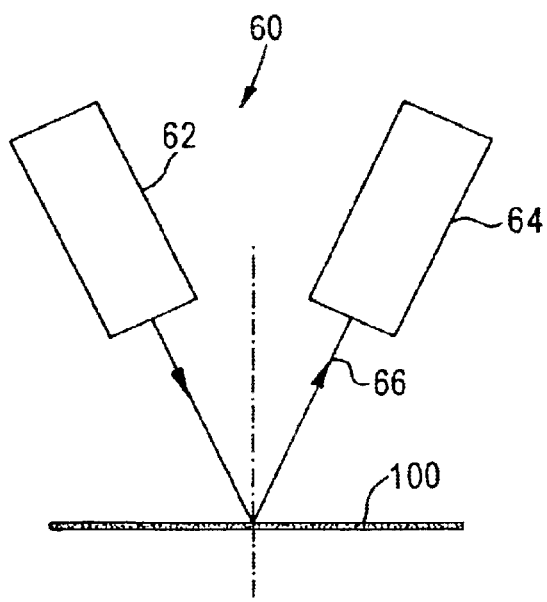
FIG. 6 schematically illustrates an optical scatterometry test using the test structure of the present invention.

After the grating structure 100 has been formed, the dimensional characteristics of the lines 24, 30 in the grating structure 100 can be measured using an optical technique, such as scatterometry, as illustrated in FIG. 6. The method of determining dimensional characteristics of the lines 24, 30 by scatterometry is not limited as to the type of scatterometry tool used, and examples of scatterometry tools include 2 Theta-type systems and lens-type systems. The scatterometry tool may use white light, or other wavelength or combination of wavelengths, depending on the specific implementation.

Typically, the scatterometry tool 60 generates an incident beam 66 from emitter 62 that has a wide spectral composition, and the intensity of the light 66 changes relative to changes in wavelength. The light 66 reflected from the grating structure 100 is measured by a receiver 64. The angle of incidence of the light 66 onto the grating structure 100 may also vary, depending on the specific implementation. Also, the profile traces generated by the scatterometry tool 60 may be based upon a comparison of light intensity to wavelength (for white light, fixed angle type scatterometry tools) or a comparison of intensity to incident angle (for angle resolved systems that use a single light source). For example, a spectroscopic ellipsometer (single angle, many wavelengths), or a laser (single wavelength, many angles) may be used. In addition, the intensity of the reflected light may be measured as s- and p-polarization over either multiple angles or at multiple wavelengths.

From the data obtained by the scatterometry tool, a line width W of the lines can be obtained. The line width obtained from the scatterometry tool can than be compared to the line width calculated using the line width measuring structure. In this manner, the results of the two tests can be double checked with one another to thereby provide a more robust testing of the semiconductor device.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A semiconductor device, comprising:
   a scatterometry structure including a plurality of parallel lines, a first portion and a second portion of said scatterometry structure have different heights, and sad first portion includes said plurality of parallel lines, wherein
   one of the multiple parallel lines is connected to a line width measurement structure.

2. The semiconductor device according to claim 1, wherein the line width measurement structure includes a first pair and a second pair of electrodes connected to the line.

3. The semiconductor device according to claim 2, further comprising a third pair of electrodes connected to the line.

4. The semiconductor device according to claim 3, wherein the second and third pair of electrodes form a sheet resistance test structure.

5. The semiconductor device according to claim 4, wherein the sheet resistance test structure is a cross bridge test structure.

6. The semiconductor device according to claim 1, wherein the line is positioned substantially at the center of the scatterometry structure.

7. The semiconductor device according to claim 1, wherein the line has a greater length than other lines in the scatterometry structure.

8. The semiconductor device according to claim 1, wherein the line is formed from polysilicon.

9. The semiconductor device according to claim 1, wherein the line is formed from metal.

10. A method of manufacturing a semiconductor device, comprising the steps of:
    depositing a layer over a substrate;
    etching the layer to form a grating structure; and
    performing scatterometry test on the grating structure to obtain a line width of the lines, wherein
    the grating structure includes a plurality of parallel lines and one of the multiple parallel lines is connected to a line width measurement structure.

11. The method according to claim 10, wherein the line width measurement structure includes a first pair and a second pair of electrodes connected to the line.

12. The method according to claim 10, wherein the step of etching the layer also forms the line width measurement structure.

13. The method according to claim 12, wherein the step of etching the layer also forms a sheet resistance test structure.

14. The method according to claim 13, wherein the sheet resistance test structure is a cross bridge test structure.

15. The method according to claim 10, wherein the line is positioned substantially at the center of the grating structure.

16. The method according to claim 10, wherein the line has a greater length than other lines in the grating structure.

17. The method according to claim 10, wherein the line is formed from polysilicon.

18. The method according to claim 10, further comprising the steps of:
    calculating a line width of the lines using the scatterometry test;
    calculating a line width of the line using the line width measurement structure; and
    comparing both calculated line widths.

19. A method of manufacturing a semiconductor device, comprising the steps of:
    depositing a layer over a substrate;
    etching the layer to form a grating structure, a cross bridge test structure and a line width measurement structure, the grating structure includes a plurality of parallel lines and one of the multiple parallel lines is connected to the line width measurement structure and the cross bridge test structure;
    performing a scatterometry test on the grating structure;
    calculating a line width of the lines using the scatterometry test;
    calculating a line width of the line using the line width measurement structure; and
    comparing both calculated line widths.

* * * * *